(12) United States Patent
Eshed et al.

(10) Patent No.: US 8,760,037 B2
(45) Date of Patent: Jun. 24, 2014

(54) CONTROLLABLE COUPLING FORCE

(76) Inventors: Gal Eshed, Nesher (IL); Nir Karasikov, Haifa (IL); Allan C. Entis, Tel Aviv (IL)

( * ) Notice: Subject to any disclaimer, the term of this patent is extended or adjusted under 35 U.S.C. 154(b) by 0 days.

(21) Appl. No.: 12/517,261

(22) PCT Filed: Dec. 2, 2007

(86) PCT No.: PCT/IL2007/001485
§ 371 (c)(1),
(2), (4) Date: Jun. 2, 2009

(87) PCT Pub. No.: WO2008/065670
PCT Pub. Date: Jun. 5, 2008

(65) Prior Publication Data
US 2010/0084945 A1 Apr. 8, 2010

(30) Foreign Application Priority Data
Dec. 2, 2006 (GB) .................................. 0624144.2
Dec. 2, 2006 (GB) .................................. 0624146.7

(51) Int. Cl.
*H01L 41/053* (2006.01)
*H02N 2/04* (2006.01)
(52) U.S. Cl.
USPC ..................................... 310/323.09; 310/345

(58) Field of Classification Search
USPC .................. 310/323.01–323.21, 328, 345
See application file for complete search history.

(56) References Cited

U.S. PATENT DOCUMENTS

| | | | |
|---|---|---|---|
| 5,453,653 A | | 9/1995 | Zumeris |
| 5,852,336 A | * | 12/1998 | Takagi ..................... 310/323.01 |
| 6,100,517 A | | 8/2000 | Yahav |
| 7,075,211 B1 | | 7/2006 | Ganor |
| 7,607,717 B2 | * | 10/2009 | Browne et al. ............. 296/180.1 |
| 2005/0258711 A1 | * | 11/2005 | Funakubo ................ 310/323.16 |
| 2006/0238072 A1 | * | 10/2006 | Funakubo ................ 310/323.16 |

FOREIGN PATENT DOCUMENTS

EP 1753040 2/2007

* cited by examiner

*Primary Examiner* — Derek Rosenau

(57) ABSTRACT

Apparatus for coupling a piezoelectric motor to a moveable body, the motor having a coupling surface for coupling to the moveable body, the apparatus comprising: at least one elastic element that provides at least a portion of a coupling force for pressing the coupling surface of the piezoelectric motor to the moveable body; and at least one shape memory component that is controllable to change shape and/or phase; wherein the at least a portion of the coupling force provided by an elastic element of the at least one elastic element changes responsive to changes in shape and/or phase of the at least one memory component.

17 Claims, 9 Drawing Sheets

CONTROLLABLE COUPLING FORCE

RELATED APPLICATIONS

The present application is a US National Phase of PCT Application No. PCT/IL2007/001485, filed on Dec. 2, 2007, which claims the benefit under 35 U.S.C. 119(a) of British Patent Application No. 0624146.7 filed on Dec. 2, 2006 and British Patent Application No. 0624144.2 filed on Dec. 2, 2006, the disclosures of which are incorporated herein by reference.

FIELD OF THE DISCLOSURE

The disclosure relates to piezoelectric motors and to methods of coupling a piezoelectric motor to a moveable body.

BACKGROUND

A piezoelectric motor uses a piezoelectric vibrator to transduce electrical energy into kinetic energy that the motor transmits to a moveable body to which the motor is coupled. The motor is generally coupled to the body by resiliently pressing the motor to the body so that a surface region, hereinafter referred to as a "coupling surface", of the piezoelectric vibrator contacts a surface region of the body. Electrodes in the motor are electrified to excite vibrations in the vibrator that cause the coupling surface to vibrate. Motion is transmitted from the vibrating coupling surface to move the body by frictional forces between the coupling surface and the surface region, hereinafter a "contact surface", of the body to which the coupling surface is pressed. A suitable elastic element, generally a coil or leaf spring, provides the "coupling force" that resiliently presses the motor coupling surface to the contact surface of the body.

Typically, a coupling surface of a piezoelectric motor comprises a shaped protuberance, a "friction nub" made from a hard, wear resistant material that is mounted to a surface of the motor. Friction nubs may be formed from Alumina, a high impact plastic such as PEEK (polyethyl ethyl ketone) or a cermet alloy. "Cermet" refers to an alloy formed by bonding ceramic particles with a metal such as, for example, Ti, W, Ta or Mo. Cermet alloys of different composition and characteristics are well known in the art and are used, for example, for bearings, seals and cutting tools.

For a given motor coupling surface, such as a friction nub, used to transmit energy from a piezoelectric motor to a moveable body, the nub and the contact surface of the moveable body to which the nub is pressed undergo relatively rapid mutual wear during an initial run-in period of use. Wear during the run-in period engenders mutual shaping and surface conditioning of the nub and motor contact surface that fine tunes matching of the nub and contact surface to each other. As the fine tune matching of the surfaces progresses, control of motion and positioning of the body by the piezoelectric motor improves and stabilizes, and rate of wear of the surfaces asymptotes to a relatively moderate, steady state wear rate.

U.S. Pat. No. 5,453,653, the disclosure of which is incorporated herein by reference, describes a piezoelectric motor having a friction nub bonded to an edge surface of a thin rectangular piezoelectric vibrator having relatively large parallel planar face surfaces and narrow edge surfaces. Electrodes on the face surfaces of the vibrator are electrified to excite and control vibrations in the vibrator and thereby in the vibrator friction nub in a plane parallel to the planes of the face surfaces. An elastic element that applies force to an edge surface of the vibrator opposite the edge surface to which the friction nub is bonded provides a resilient coupling force that couples the motor friction nub to a contact surface of a moveable body.

U.S. Pat. No. 7,075,211, the disclosure of which is incorporated herein by reference, describes piezoelectric motors comprising a rectangular vibrator having large planar face surfaces and a friction nub on a narrow edge surface of the vibrator that can be excited to generate vibrations in the nub selectively in or perpendicular to the plane of the vibrator.

SUMMARY

An aspect of some embodiments of the present invention relates to providing a coupling apparatus for coupling a piezoelectric motor to a moveable body that can be controlled to provide different magnitudes of resilient force for coupling a coupling surface of the motor to a contact surface of a moveable body.

An aspect of some embodiments of the invention relates to providing an air vent comprising at least one element moveable by a piezoelectric motor to control direction in which air exits the air vent wherein the motor is coupled to the at least one moveable element using a coupling apparatus in accordance with an embodiment of the invention.

According to an aspect of some embodiments of the invention, the coupling apparatus is controllable to provide at least two coupling states for the piezoelectric motor and the moveable body. Optionally, the at least two coupling states comprise at least one engaged state and a disengaged state. In the at least one engaged state, the coupling apparatus provides a coupling force that enables the piezoelectric motor to relatively efficiently control motion and positioning of the moveable body. In the disengaged state, the coupling apparatus applies a reduced force to the motor vibrator. In accordance with an embodiment of the invention, the reduced force is sufficient to maintain contact between the motor coupling surface and the contact surface of the moveable body but enables the moveable body to be relatively easily moved by hand and/or by a motor other than the piezoelectric motor without generating possibly damaging stress to the piezoelectric motor.

By providing a reduced force that disengages the motor from the moveable body but maintains contact between the motor coupling surface and the body's contact surface, the coupling apparatus substantially maintains relative orientation of the coupling surface and the contact surface. Maintaining contact and thereby mutual orientation between the coupling surface and contact surface substantially reduces disturbance of a wear pattern created during a run-in period of use that matches the two surfaces. Were the coupling apparatus to completely separate the coupling surface from the contact surface in the disengaged state, upon reengaging the two surfaces and bringing them into contact, they would have a relatively increased tendency to be brought into contact with the wear patterns of the surfaces misaligned. Misaligned, the surfaces would be subject to a new run-in period of relatively accelerated mutual wear and, generally, less efficient control of motion of the moveable body. Repeated coupling and uncoupling, i.e. engaging and disengaging, of the surfaces in which the coupling surface and contact surface are substantially completely separated and subsequently brought into contact, would result in shorter lifetimes for the surfaces and periodic impaired control of motion of the moveable body.

According to an aspect of some embodiments of the invention, the at least one coupling apparatus comprises a component, hereinafter a "shape memory component" that is used to control the coupling force provided by the coupling apparatus.

The shape memory component is formed from a shape memory material that can be configured with at least one "remembered shape". The shape memory material has a first phase in which it is relatively easily deformed and a second phase in which it tends to maintain a remembered shape and is not easily deformed. If in the first phase, the material is deformed to a shape other than the remembered shape, the material can generally be returned to its remembered shape by controlling the material temperature to transform the material to its second phase. In transforming to the second phase and the remembered shape, the material will resist relatively large forces that operate to prevent the material from assuming its remembered shape.

In accordance with an embodiment of the invention, a coupling force applied by the coupling apparatus to engage a piezoelectric motor to a moveable body is a function of the shape and/or phase of the shape memory component. The force is different when the shape memory component is in the first relatively malleable phase than when it is in its second phase in which it "forcefully" tends to assume and maintain its remembered shape. Controlling the temperature of the shape memory component controls the phase and/or shape of the component and thereby the coupling force provided by the coupling component. Optionally, the shape memory material is a shape memory alloy (SMA). Optionally, the shape memory material is a shape memory polymer.

For convenience of presentation, the shape memory material is assumed to be an SMA, such as for example any of the conventional SMA alloys of Ni—Ti, Cu—Zn-A or Cu—Al—Ni. An SMA alloy has a first phase referred to as a martensite phase, in which it is relatively easily plastically deformed, and a second phase referred to as an austenite phase, in which it is not easily deformed. The alloy may be transformed from the martensite phase to the austenite phase by raising the alloy temperature above a transformation temperature (TTR). The alloy can subsequently be returned to the martensite phase by lowering the temperature below the TTR. The transformation temperature is sensitive to the alloy composition and can generally be determined to be a temperature in a range between about −150° C. and about +150° C.

An object made from a SMA can be programmed using any of various suitable heating processes known in the art with a shape, i.e. a remembered shape that it assumes in the austenite phase. In the martensite phase the object can generally be relatively easily plastically deformed and will not maintain its shape when stressed by relatively moderate force. In the martensite phase if the object is deformed to a shape other than the remembered shape and then heated to the austenite phase, the object will exhibit shape memory and revert to, and maintain in the austenite phase, the remembered shape. The transition to the remembered shape will generally occur and the remembered shape maintained "aggressively", even if opposed by a relatively large force.

In some embodiments of the invention, the coupling apparatus is configured to normally provide a coupling force that maintains the piezoelectric motor engaged with the moveable body in an engaged state of the at least one engaged state. When the at least one shape memory component undergoes a phase change from martensite to austenite, or alternatively from austenite to martensite, the coupling apparatus reduces the coupling force and optionally disengages the motor.

In some embodiments of the invention, the coupling apparatus is configured to normally provide a relatively small coupling force that maintains the piezoelectric motor disengaged. When the at least one shape memory component undergoes a phase change from martensite to austenite or, alternatively from austenite to martensite, the coupling apparatus increases the coupling force and optionally changes the state of the motor to an engaged state.

In an embodiment of the invention, the coupling apparatus comprises at least one resilient component, such as a spring, that provides a resilient force for coupling the motor to the body. The at least one spring is coupled to at least one shape memory component whose shape is controllable to control a length to which at least a portion of the at least one spring extends and thereby the coupling force provided by the spring. Optionally, the spring is a coil spring. Optionally, the spring is a leaf spring. In an embodiment of the invention, the shape memory component is a shape memory wire whose length is controlled to control extension of the spring by controlling temperature of the wire.

In some embodiments of the invention, the shape memory component is a spring formed from a shape memory material and the transformation temperature is determined to be a temperature below an operating temperature of the piezoelectric motor. The spring is therefore normally in an austenite phase when the motor is engaged to the moveable body, and the spring provides at least a portion of the coupling force that engages the motor to the moveable body.

To disengage the motor from the moveable body, the temperature of the spring is lowered to below the transition temperature and the spring transformed to a martensite phase. In the martensite phase, the spring is relatively easily plastically deformed and does not substantially provide force that contributes to coupling the motor to the moveable body.

Therefore, when the spring is transformed to the martensite phase, force pressing the coupling surface of the motor to the movable body is reduced and the motor disengaged.

In some embodiments of the invention, the transformation temperature of the SMA from which the spring is formed is determined to be a temperature greater than an ambient temperature when the motor is not operating. Optionally, the transformation temperature is less than an operating temperature of the piezoelectric motor. When the motor is not operating the spring is therefore normally in a martensite phase, in which phase the spring is easily plastically deformed, does not contribute substantially to force coupling the piezoelectric motor to the moveable body and the motor is therefore in a disengaged state. To change the state of the motor to an engaged state in which the coupling force is increased so that the motor is controllable to appropriately control motion of the moveable body, the temperature of the spring is increased to at least the transformation temperature to change the phase of the spring to the austenite phase. In the austenite phase the spring assumes a remembered shape in which it contributes sufficient force to the coupling force to engage the motor.

There is therefore provided, in accordance with an embodiment of the invention, apparatus for coupling a piezoelectric motor to a moveable body, the motor having a coupling surface for coupling to the moveable body, the apparatus comprising: at least one elastic element that provides at least a portion of a coupling force for pressing the coupling surface of the piezoelectric motor to the moveable body; and at least one shape memory component that is controllable to change shape and/or phase; wherein the at least a portion of the coupling force provided by an elastic element of the at least one elastic element changes responsive to changes in shape and/or phase of the at least one memory component.

Optionally, the at least one shape memory component comprises at least one wire made from a shape memory material. Optionally, the at least one wire is coupled to an elastic element of the at least one elastic element. Optionally, the at least one wire is controllable to change shape by changing length from a longer length to a shorter length. Optionally, the at least one wire changes from the longer length to the shorter length, the at least a portion of the coupling force provided by the at least one elastic element of the at least one elastic element decreases.

In some embodiments of the invention, when the at least one wire shortens, at least a portion of the at least one elastic element compresses. In some embodiment of the invention, when the wire shortens, at least a portion of the at least one elastic element bends.

In some embodiments of the invention, the at least one elastic element comprises at least one spring. Optionally, the at least one spring comprises at least one coil spring. Optionally, when at least one wire changes shape, an entire coil spring of the at least one coil spring compresses. Alternatively, when at least one wire changes shape optionally, only a portion of a coil spring of the at least one coil spring compresses. In some embodiments of the invention, the at least one elastic element comprises at least one leaf spring having at least one leaf coupled to at least one wire. Optionally, when the at least one wire changes shape, the at least one leaf bends.

In some embodiments of the invention, the at least one wire comprises a plurality of wires. Optionally, at least two of the plurality of wires is coupled to a different part of a same elastic element of the at least one elastic element. Optionally, each wire of the at least two wires is controllable to shorten independently of the other of the two wires. Optionally, as more of the wires are shortened, the at least a portion of the coupling force provided by the same elastic element progressively decreases.

In some embodiments of the invention, the same elastic element comprises a spring. Optionally, the spring comprises a coil spring. Optionally, the coil spring comprises a plurality of coils. Optionally, each wire of the at least two wires is coupled to a different coil of the coil spring.

In some embodiments of the invention, the spring comprises a leaf spring. Optionally, the leaf spring comprises a plurality of leafs. Optionally, each wire of the at least two wires is coupled to a different leaf of the leaf spring.

In some embodiments of the invention, the at least one shape memory component has a first phase in which it assumes a remembered shape that it maintains under relatively large stress and a second pliable phase in which it is plastically deformable by relatively small stress and the component is controllable to change shape to or from the remembered shape respectively from or to a shape to which it is deformed in the second phase.

Optionally, an elastic element of the at least one elastic element is a shape memory component of the at least one shape memory component. Optionally, when the elastic element changes from the first phase to the second phase, the at least a portion of the coupling force decreases. Optionally, the elastic element is a spring. Optionally, the spring is a coil spring. Optionally the spring is a leaf spring.

In some embodiments of the invention, the at least one shape memory component is controlled to change from the first phase to the second phase by controlling temperature of the component. Optionally, the at least one shape memory component is characterized by a transformation temperature above which it is in the first phase and below which it is in the second phase. Optionally, the transformation temperature is a temperature greater than an ambient temperature of an environment in which the piezoelectric motor is expected to operate. Alternatively, the transformation temperature is a temperature less than an ambient temperature of an environment in which the piezoelectric motor is expected to operate.

In some embodiments of the invention, the transformation temperature is less than or equal to an operating temperature of the piezoelectric motor.

In some embodiments of the invention, the transformation temperature is greater than or equal to an operating temperature of the piezoelectric motor.

In some embodiments of the invention, the apparatus comprises a heating device for heating the shape memory component.

In some embodiments of the invention, a cooling device for cooling the shape memory component.

In some embodiments of the invention, the shape memory component is formed from a shape memory alloy. In some embodiments of the invention, the shape memory component is formed from a shape memory polymer.

There is further provided in accordance with an embodiment of the invention, apparatus for coupling a piezoelectric motor having a coupling surface for coupling the motor to a moveable body, the apparatus comprising: at least one elastic element that provides at least a portion of a coupling force for pressing the coupling surface of the piezoelectric motor to the moveable body; and at least one shape memory component that is controllable to change phase; wherein the at least a portion of the coupling force provided by an elastic element of the at least one elastic element changes responsive to changes in phase of the at least one shape memory component.

There is further provided in accordance with an embodiment of the invention, an air vent for controlling direction of airflow comprising: an outlet head formed having an exit port through which air exits the vent and comprising at least one element moveable to selectably determine a direction in which air exits the exit port; at least one piezoelectric motor having a coupling surface for coupling the motor to a moveable body and controllable to move the at least one moveable element; and a coupling apparatus that provides a coupling force for coupling the coupling surface of the at least one piezoelectric motor to the at least one moveable element; wherein the coupling apparatus is controllable to control the coupling force and the at least one piezoelectric motor is controllable to determine a direction in which air exits the exit port.

Optionally, the air vent comprises a controller. Optionally, the controller controls the coupling apparatus. Optionally, the controller controls the coupling apparatus to determine coupling force magnitude to selectively engage the motor to, or disengage the motor from, the at least one moveable element. Optionally, controller is configured to control the coupling apparatus to disengage the motor to facilitate manual adjustment of the at least one moveable element.

Optionally, the controller comprises at least one sensor that generates a signal when a user attempts manual adjustment of the air vent and disengages the motor responsive to the signal. Optionally, the at least one sensor comprises a haptic sensor that generates a signal responsive to which the controller disengages the motor when the user touches the vent to manually adjust the air vent. Additionally or alternatively, the at least one sensor optionally comprises a strain gauge that generates a signal responsive to which the controller disengages the motor when the at least one piezoelectric motor is engaged and the user attempts to manually adjust the air vent. Optionally, the strain gauge generates the signal responsive to strain in the at least one piezoelectric motor.

In some embodiments of the invention, the controller comprises a user interface and the controller controls the coupling apparatus to disengage the at least one piezoelectric motor responsive to user input to the interface indicating that manual adjustment of the vent is desired.

In some embodiments of the invention, the controller normally, in default, controls the coupling apparatus to provide a magnitude of coupling force that maintains the motor engaged. In some embodiments of the invention, the controller normally, in default, controls the coupling apparatus to provide a magnitude of coupling force that maintains the motor disengaged.

In some embodiments of the invention, the controller controls the motor to vibrate the motor coupling surface substantially only in a direction perpendicular to a surface region of the at least one moveable element to disengage the motor from the at least one moveable element.

In some embodiments of the invention, the controller controls the at least one piezoelectric motor to determine a direction in which the air exits the vent. Optionally, the controller comprises an audio sensor and controls the at least one piezoelectric motor responsive to audio signals. Optionally, the audio signals are human vocalizations. Additionally or alternatively, the controller optionally controls the at least one piezoelectric motor responsive to a direction of the audio signals.

In some embodiments of the invention, the controller comprises a vision system and controls the at least one piezoelectric motor responsive to images provided by the vision system. Optionally, the controller controls the at least one piezoelectric motor responsive to position of a feature in the field of vision of the vision system.

In some embodiments of the invention, the controller comprises at least one biometric sensor and controls the at least one piezoelectric motor responsive to at least one biometric feature of a person sensed by the biometric sensor. Optionally, the at least one biometric feature comprises the person's size. Additionally or alternatively, the at least one biometric feature optionally comprises the person's height. In some embodiments of the invention, the at least one biometric feature comprises the person's weight. In some embodiments of the invention, the at least one biometric feature comprises the person's face. In some embodiments of the invention, the at least one biometric feature comprises the person's fingerprint.

In some embodiments of the invention, the controller comprises a manually operated interface and controls the at least one piezoelectric motor responsive to manual operation of the interface.

In some embodiments of the invention, the at least one moveable element comprises the outlet head and the piezoelectric motor is controllable to move the outlet head to determine a direction in which the outlet port faces to determine direction in which air exits the exit port. In some embodiments of the invention, the outlet head comprises moveable vanes that direct air exiting the exit port. In some embodiments of the invention, the at least one piezoelectric motor is coupled to the vanes and is controllable to move the vanes to determine a direction in which the air exits the outlet port.

In some embodiments of the invention, the coupling apparatus comprises: at least one elastic element that provides at least a portion of a coupling force for pressing the coupling surface of the piezoelectric motor to the at least one moveable element; and at least one shape memory component that is controllable to change shape and/or phase; wherein the at least a portion of the coupling force provided by an elastic element of the at least one elastic element changes responsive to changes in shape and/or phase of the at least one memory component.

In some embodiments of the invention, an automotive air vent comprises an air vent according to an embodiment of the invention.

BRIEF DESCRIPTION OF FIGURES

The invention will be more clearly understood by reference to the following description of embodiments thereof read in conjunction with the figures attached hereto. In the figures, identical structures, elements or parts that appear in more than one figure are generally labeled with a same numeral in all the figures in which they appear. Dimensions of components and features shown in the figures are chosen for convenience and clarity of presentation and are not necessarily shown to scale. The figures are listed below.

DETAILED DESCRIPTION OF EXEMPLARY EMBODIMENTS

Figure 1:
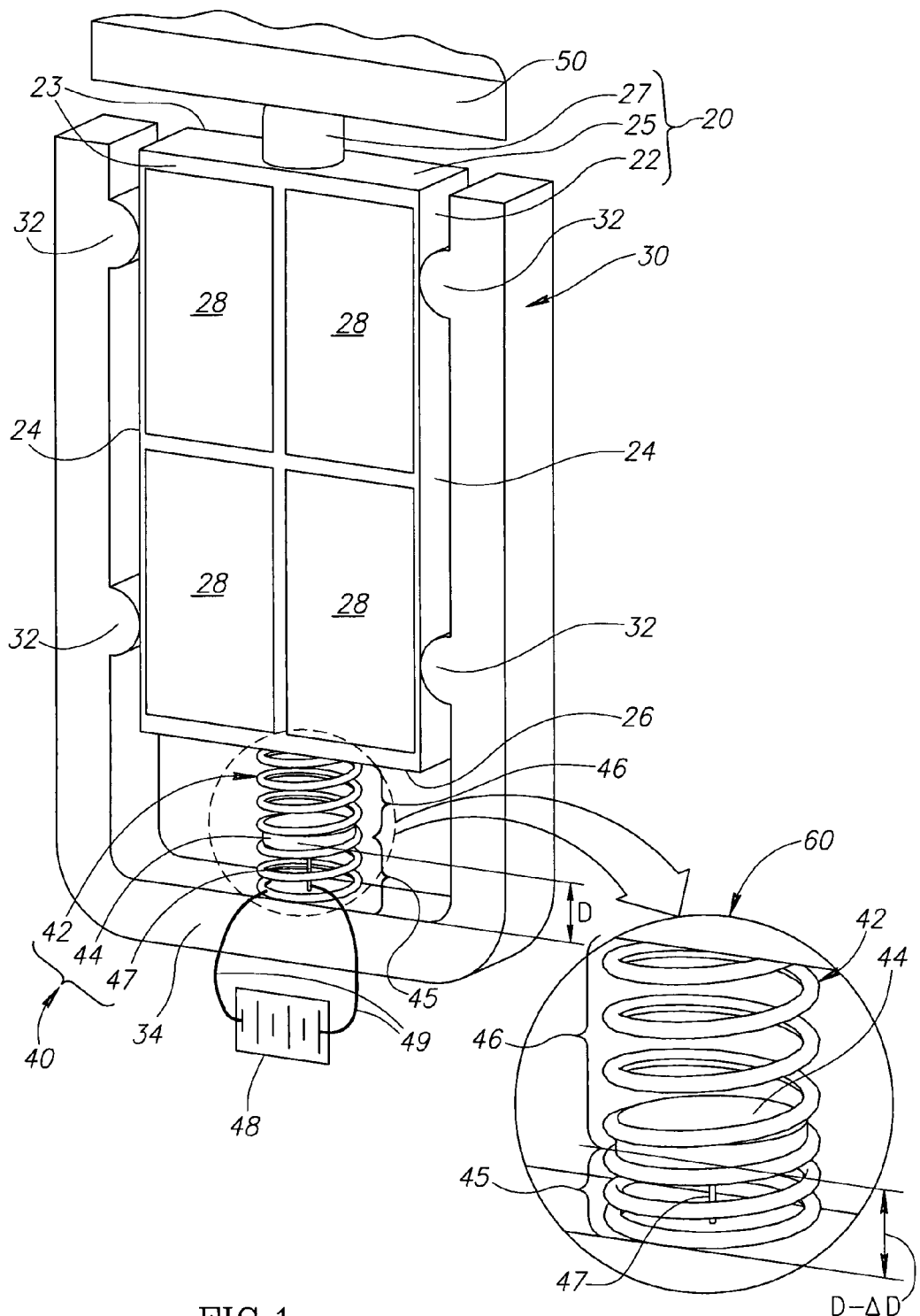
FIG. 1 schematically shows a piezoelectric motor having a coupling apparatus controlled by a shape memory alloy control wire to provide different coupling forces for coupling the motor to a moveable body, in accordance with an embodiment of the invention.

FIG. 1 schematically shows a piezoelectric motor 20 mounted to a motor mounting frame 30 comprising a coupling apparatus 40 controllable to provide different coupling forces for coupling the motor to a moveable body 50, only a part of which is shown, in accordance with an embodiment of the present invention.

Piezoelectric motor 20 is, for example, of a type described in above referenced U.S. Pat. No. 5,453,653. The motor comprises a thin rectangular ceramic piezoelectric vibrator 22 having front and back planar face surfaces 23, of which only an edge of back surface 23 is seen in the perspective of the figure, relatively long edge surfaces 24 and relatively short top and bottom edge surfaces 25 and 26 respectively. A friction nub 27 for coupling motor 20 to body 50 is bonded to top edge surface 25. Optionally, four quadrant electrodes 28 are located in a symmetric checkerboard pattern on front face surface 23. A single large electrode (not shown) is located on back surface 23. Vibrations in piezoelectric motor 20 are excited by electrifying quadrant electrodes 28 relative to the large electrode using any of various voltage configurations as is known in the art. The vibrations are controllable to generate vibratory motion in friction nub 27 that control motion and positioning of body 50.

Mounting frame 30 grasps and holds piezoelectric motor 20 using any devices and methods known in the art. By way of example, mounting frame 30 is U shaped and has grasping tines 32 that press against long edge surfaces 24 of piezoelectric vibrator 22 to secure the vibrator in the frame. Optionally, frame 30 is shaped and formed from a sufficiently elastic material so that tines 32 press against edges 24 with resilient force. Optionally, tines 32 press against the long edges at regions of the edges that are nodal regions of the vibrator at an operating frequency of the vibrator. In some embodiments of the invention, frame 30 is formed from a resilient plastic.

Coupling apparatus 40 is located on a base bar 34 of frame 30 and optionally comprises a biasing coil spring 42 that presses on bottom edge surface 26 of piezoelectric motor 20 to resiliently press the motor's friction nub 27 to body 50. Biasing spring 42 is optionally secured to base bar 34 and optionally has an anchor plate 44 fixed to a coil or coils of the spring at a distance "D" from the base that divides biasing spring 42 into lower and upper portions 45 and 46 respectively.

Anchor plate 44 is connected to a shape memory alloy (SMA) control wire 47 that extends from the anchor plate and is optionally tethered to base bar 34. SMA control wire 47 is connected to a power supply 48 controllable to generate current in the SMA control wire sufficient to heat the wire and raise its temperature above a transformation temperature of the wire at which transformation temperature the wire changes from a martensite phase to an austenite phase. Optionally, anchor plate 44, and biasing spring 42 are conductors and power supply 48 is connected to biasing spring 42 to complete a current path for current that the power supply generates in SMA control wire 47. In FIG. 1, power supply 48 is schematically shown connected to SMA control wire 47 and spring by wires 49.

In an embodiment of the invention, SMA control wire 47 has a transition temperature from martensite to austenite that is greater than an ambient temperature of the motor during motor operation. Normally, SMA control wire 47 is therefore in the martensite phase, is relatively pliable and substantially does not apply force to anchor plate 44, nor therefore substantially affect a coupling force that biasing spring 42 applies to bottom edge surface 26. However, in accordance with an embodiment of the invention, SMA control wire 47 is programmed with a remembered shape that causes it to contract and assume a shortened length when power supply 48 heats the SMA wire to a temperature above its transformation temperature and the wire changes phase to austenite. When the SMA control wire contracts, it pulls anchor plate 44 down towards base bar 34 and shortens distance D at which the anchor plate is displaced from the base bar by a distance ΔD. As a result of the reduction in distance D, lower spring portion 45 of biasing spring 42 contracts and upper spring portion 46 extends, reducing force that the biasing spring applies to bottom edge 26 of vibrator 22. Inset 60 schematically shows power supply 48 controlled to generate current in SMA control wire 47 that shortens the wire and thereby bottom wire portion 45 and reduces force that the biasing spring applies to bottom edge surface 26.

In accordance with an embodiment of the invention, D, and the characteristics of biasing spring 42 are determined so that when SMA control wire 47 is in the martensite phase and does not substantially affect the biasing spring, the biasing spring presses on bottom surface 26 with sufficient force so that the motor is in an engaged state and can effectively control motion of body 50. In addition, D, ΔD and the characteristics of biasing spring 42 are determined so that when the spring is shortened by SMA control wire 47, friction nub 27 remains in contact with moveable body 50 but the motor is effectively disengaged from the body. With the motor disengaged, moveable body 50 may be moved by hand and/or by a motor other than piezoelectric motor 20 without generating possibly damaging stress on the piezoelectric motor and without the piezoelectric motor substantially resisting the motion generated manually or by the other motor.

It is noted that for coupling apparatus 40 the transformation temperature for SMA control wire 47 is above the ambient temperature in which piezoelectric motor 20 is expected to operate. The motor is normally engaged and the control wire is heated to disengage the motor. In some embodiments of the invention, the transformation temperature of SMA control wire 47 is lower than the ambient temperature and the control wire is normally in its remembered "shortened" austenite phase shape as shown in inset 60 and motor 20 is normally disengaged. To engage the motor 20, control wire 47 is cooled to a temperature equal to or less than the transformation temperature, which causes control wire 47 to phase change to its malleable martensite phase. In the martensite phase, control wire 47 does not apply sufficient force on anchor plate 44 to maintain lower spring portion compressed, the lower spring portion is released, and spring 42 assumes the configuration shown to the left of inset 60 and coupling apparatus 40 engages motor 20. Control wire 47 is cooled using any suitable method known in the art and is optionally cooled using a Peltier element that is thermal coupled to the wire.

Figure 2A:
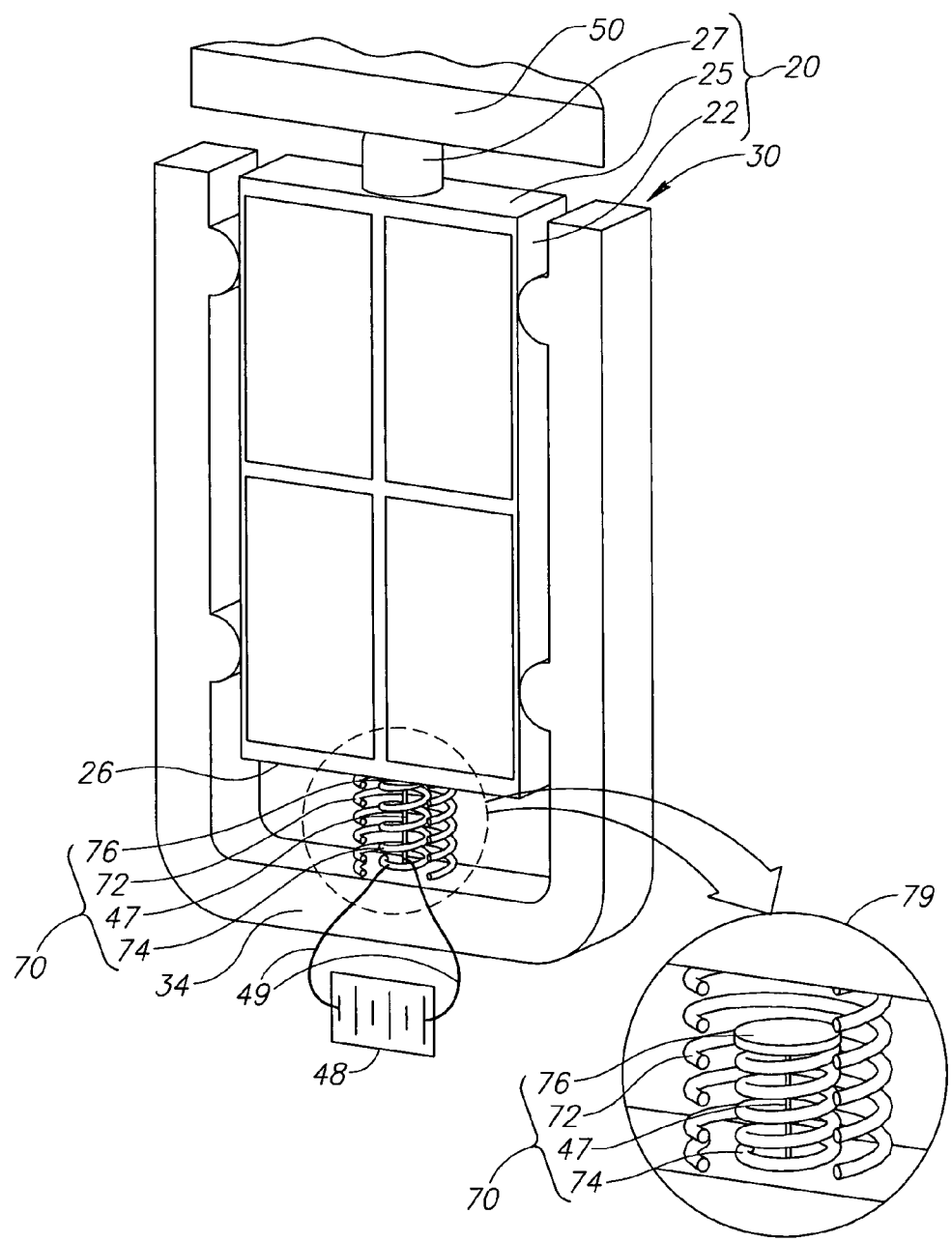
FIG. 2A schematically shows a different coupling apparatus comprising a shape memory alloy control wire, in accordance with an embodiment of the invention.

FIG. 2A schematically shows a coupling apparatus 70, in accordance with an embodiment of the invention. Coupling apparatus 70 is shown by way of example comprised in a motor frame 30 similar to that shown in FIG. 1 and providing coupling force to motor 20.

Coupling apparatus 70 optionally comprises a biasing coil spring 72, shown cutaway, that provides a coupling force for piezoelectric motor 20 and an auxiliary coil spring 74 inside and substantially concentric with the biasing spring. Auxiliary spring 74 has an anchor plate 76, optionally at an end of the spring that presses against bottom edge surface 26 of piezoelectric motor 20. A control SMA wire 47 is anchored to the anchor plate and tethered to base bar 34. Control SMA wire 47 is electrically connected to power supply 48, which is controllable to generate current in the SMA control wire to heat the control wire to a temperature above its transition temperature and cause the wire to undergo a phase change from martensite to austenite that shortens the wire.

As in the case of SMA control wire 47 shown in FIG. 1, in FIG. 2 control wire 47 is normally in the martensite phase during operation of piezoelectric motor 20 and does not substantially affect the force that auxiliary spring 74 applies to bottom edge surface 26 of the motor. As a result, during normal operation of piezoelectric motor 20 the motor is engaged to a moveable body, e.g. body 50, by a coupling force to which both biasing spring 72 and auxiliary spring 74 contribute. In the austenite phase, shown in an inset 79, auxiliary spring 74 configures in a shortened, remembered shape and pulls anchor plate 76 towards base bar 34 to reduce substantially to zero, force that the auxiliary spring applies to bottom edge surface 26 of piezoelectric vibrator 22. The total coupling force that coupling apparatus 70 provides for coupling motor 20 to moveable body 50 is thereby reduced. Optionally, the reduction in coupling force is sufficient to disengage piezoelectric motor 20 from the moveable body.

Similarly to the case of coupling apparatus 40 shown in FIG. 1, a coupling apparatus in accordance with an embodiment of the invention similar to coupling apparatus 70 has a control wire 47 characterized by a transformation temperature less than an ambient temperature of an environment in which motor 20 is expected to operate. The coupling apparatus is normally in a state shown in inset 79 and motor 20 disengaged. To engage the motor control wire 47 is cooled, optionally using a Peltier element to release inner spring 74.

Figure 2B:
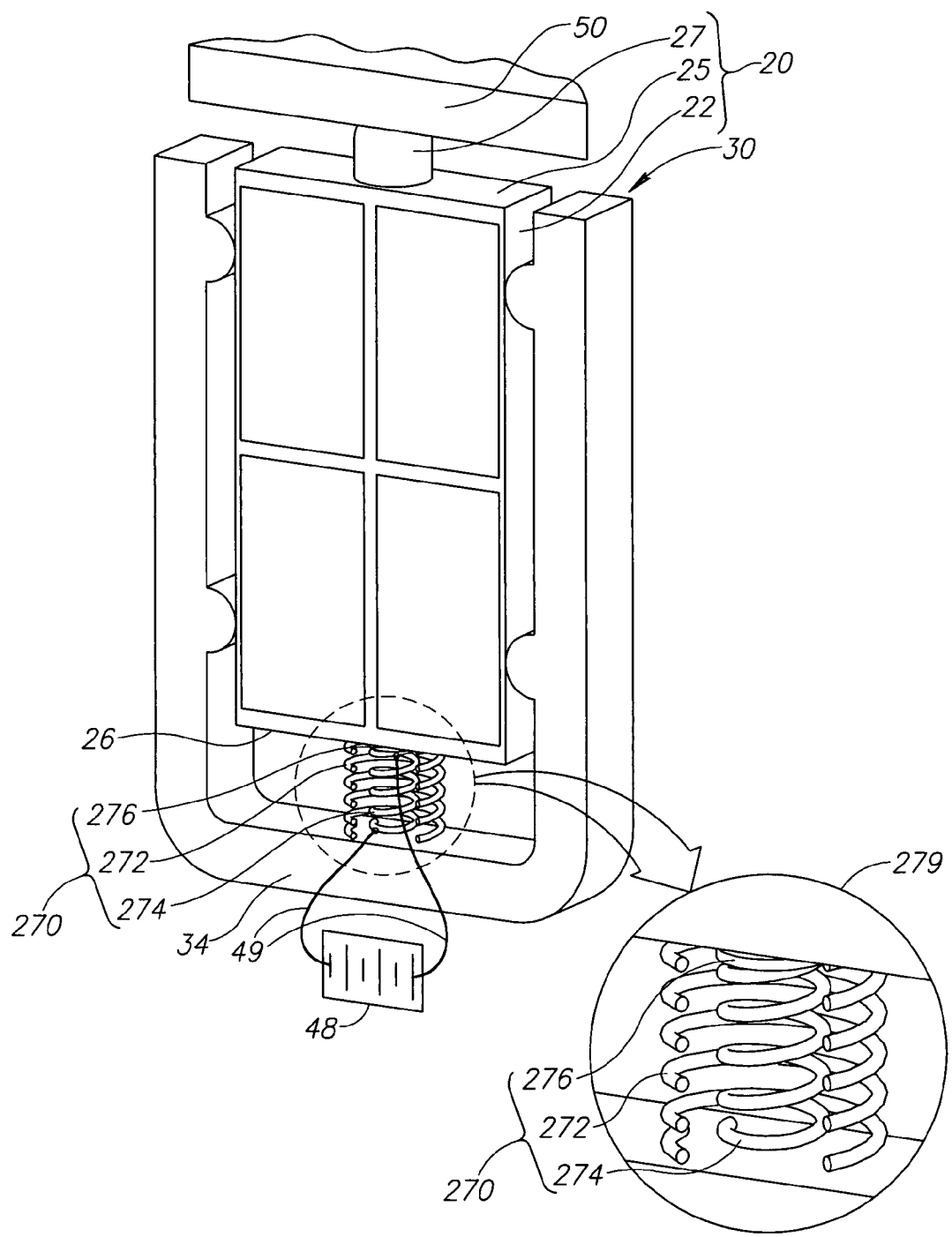
FIG. 2B schematically shows a coupling apparatus similar to that shown in FIG. 2A but comprising a shape memory alloy coil spring rather than a control wire for controlling coupling force, in accordance with an embodiment of the invention.

FIG. 2B schematically shows another embodiment of a coupling apparatus, coupling apparatus 270 comprising outer and inner concentric springs 272 and 274 respectively, in accordance with an embodiment of the invention, spring 274 having an upper end 276. For convenience of presentation, inset 279 shows an enlarged view of coupling apparatus 270 and its components.

Optionally, inner spring 274 is a spring formed at least partially from an SMA material and is connected to power supply 48 so that the power supply can be controlled to generate current in the inner spring. The SMA material from which inner spring is formed has a transformation temperature greater than an ambient temperature of an environment in which motor 20 is expected to be operating and, optionally, less than an operating temperature of the motor. At the ambient temperature, inner spring 274 is therefore in a relatively malleable, martensite phase and does not contribute substantially to a coupling force provided by coupling apparatus 270. Outer spring 272 is configured to provide sufficient force to edge surface 26 to maintain friction nub 27 in contact with moveable body 50 but not sufficient force to engage motor 20 with body 50 when inner spring 274 is in the martensite phase.

To engage motor 20 to body 50, power supply 48 is controlled to generate current in inner spring 274 to heat the spring to at least its transformation temperature and cause the spring to assume a remembered shape in which it presses on bottom edge surface 26 with sufficient force to engage the motor with body 50. In an embodiment of the invention, after being engaged and turned on, assuming that the operating temperature of the motor is above the transformation temperature, heat generated from operation of the motor contributes at least in part to maintaining spring 274 in the austenite phase and current provided by power supply 48 to inner spring 274 may be reduced or turned off. The motor remains engaged with power supply 48 providing reduced or substantially no current in the spring. When power supply 48 is controlled to stop the current it generates in inner spring 274 and as a result the motor is turned off, the temperature of the spring drops below the transformation temperature and the inner spring reverts to its martensite state and disengages piezoelectric motor 20 from body 50.

In some embodiments of the invention, motor 20 is "self engaging". The motor is turned on and heat from the motor is relied upon to heat inner spring 274 to its transition temperature and engage the motor with body 50.

It is noted, that whereas coupling apparatus 70 shown in FIG. 2A is activated to disengage a piezoelectric motor from a moveable body, coupling apparatus 270 is activated to engage a piezoelectric motor to a moveable body.

Figure 3A:
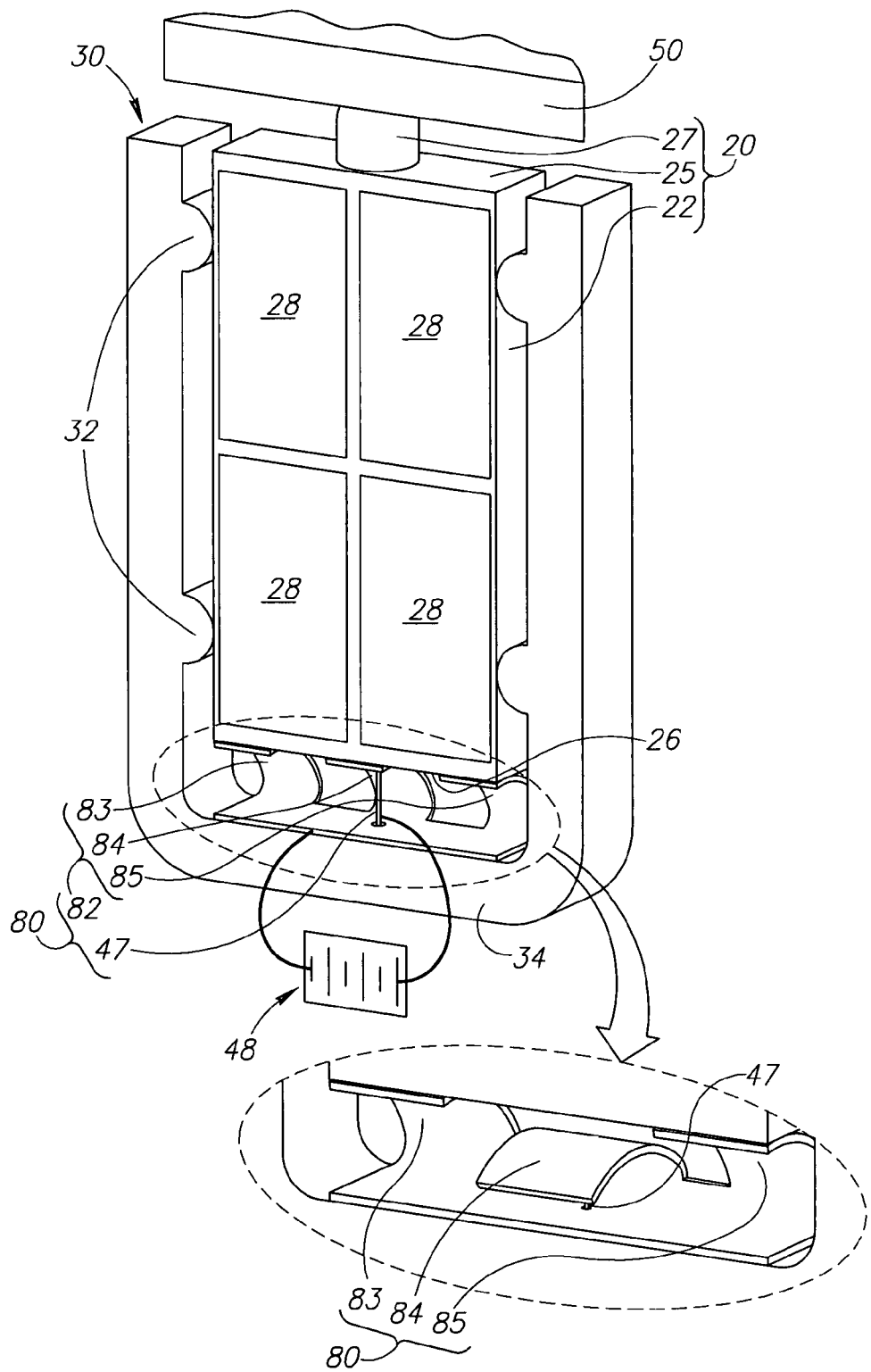
FIG. 3A schematically shows a coupling apparatus comprising a leaf spring operable to provide different coupling forces for coupling a piezoelectric motor to a moveable body, in accordance with an embodiment of the invention.

FIG. 3A schematically shows a coupling apparatus 80, in accordance with an embodiment of the invention. As in FIGS. 1 and 2, coupling apparatus 80 is mounted to a motor mounting frame similar to motor frame 30 and is shown providing coupling force for coupling motor 20 to moveable body 50.

Coupling apparatus 80 comprises a leaf spring 82 comprising a plurality of leafs, each independently pressing against bottom surface 26 of vibrator 22. By way of example, leaf spring 82 comprises three leafs 83, 84, and 85. At least one leaf, by way of example leaf 84, is connected to an SMA control wire 47 that can be controlled by power supply 48 to undergo phase change to an austenite phase in which phase the control wire it is shortened. When shortened, leaf 84 is pulled down and the leaf stops pressing on bottom edge surface 26, thereby reducing a coupling force that leaf spring 82 and thereby coupling apparatus 80 applies to piezoelectric motor 20. Optionally, when leaf 84 is pulled away from bottom edge surface 26, piezoelectric motor 20 is disengaged from moveable body 50.

It is noted that a coupling apparatus in accordance with an embodiment of the invention comprising a leaf spring similar to leaf spring 82 having a plurality of leafs may be configured and operated to provide a plurality of different coupling forces and therefore a plurality of different sates in which motor 20 is engaged to a moveable body, e.g. body 50. For example, each leaf of leaf spring 82 may be connected to a different SMA control wire so that each leaf can be controlled to press or not press on bottom edge surface 26 independently of whether another leaf presses or does not press on the bottom surface. By controlling different configurations of leafs to press against bottom edge surface 26, the leaf spring can engage motor 20 to moveable body 50 with a plurality of different coupling forces.

In accordance with an embodiment of the invention, controlling the coupling force provided by the coupling apparatus to engage the piezoelectric motor to a moveable body, is used to control an amount of time that a coupling surface, such as optionally a friction nub, of a piezoelectric motor contacts a moveable body during each vibration cycle of the coupling surface. The greater the coupling force, the longer is the contact time of the coupling surface with the contact surface of the moveable body per vibration cycle of the coupling surface. Controlling the contact time controls a time average of force that the piezoelectric motor applies to the moveable body and therefore acceleration and motion of the body.

It is further noted that a coupling apparatus in accordance with an embodiment of the invention, other than apparatus similar to coupling apparatus 80 may be configured to provide a plurality of different coupling forces. For example, a coupling apparatus having a biasing spring similar to biasing spring 42 schematically shown in FIG. 1 may comprise, in accordance with an embodiment of the invention, a plurality of anchor plates 44, each connected to a different SMA wire and located at different distances from base bar 34. By shortening different numbers of the SMA control wires, the biasing spring is controlled to provide different coupling forces.

Figure 3B:
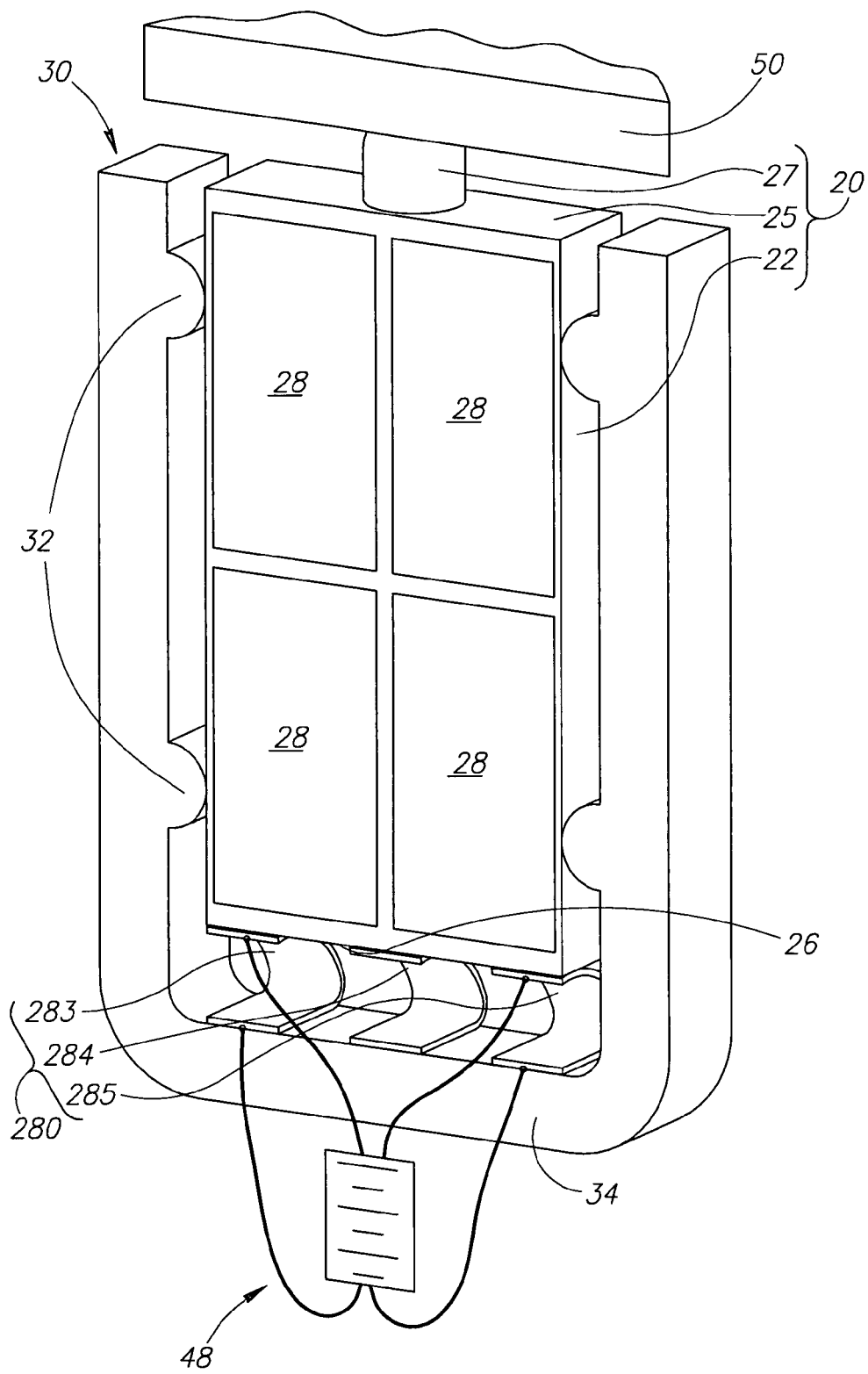
FIG. 3B schematically shows another coupling apparatus comprising a leaf spring, in accordance with an embodiment of the invention.

FIG. 3B schematically shows a coupling apparatus 280, in accordance with an embodiment of the invention.

Coupling apparatus 280 optionally comprises a central leaf spring 284 and two lateral leaf springs 283 and 285. Lateral leaf springs 283 and 285 are optionally formed from an SMA material and have transformation temperatures that are greater than an ambient temperature of an environment in which piezoelectric motor 20 is expected to operate and are optionally less than an operating temperature of the motor. Central leaf spring 284 applies sufficient force to bottom surface 26 to maintain motor 20 disengaged from body 50 but with friction nub 27 contacting the body. Motor 20 is engaged to body 50 by controlling power supply 48 to generate current selectively in leaf 283 and/or leaf 285 to heat the leaf or leafs to at least their respective transformation temperatures so that the leaf or leafs assume their remembered shape or shapes and press on bottom surface 26. Selectively heating one or the other of leafs 283 and 285, or both of the leaves provides different possible coupling forces for engaging motor 20 with body 50.

Figure 3C:
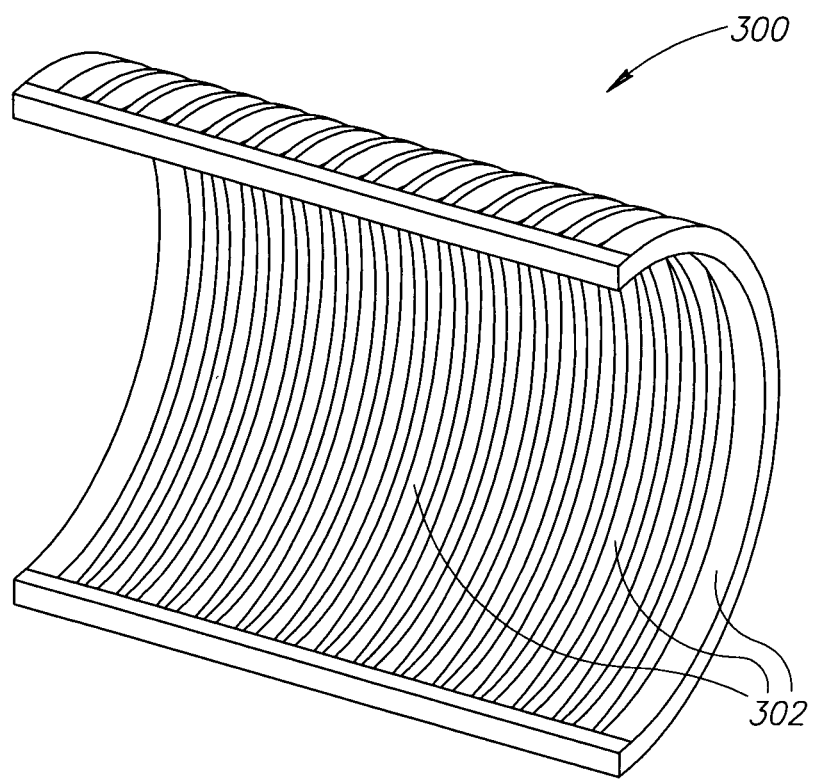
FIG. 3C schematically shows a variation of a leaf spring operable to provide different coupling forces for coupling a piezoelectric motor to a moveable body, in accordance with an embodiment of the invention.

Whereas, each leaf spring 283 and 284 shown in FIG. 3B is shown as a single solid leaf, in some embodiments of the invention, leaf springs having a given overall external envelope shape are formed having a plurality of relatively thin, component strips, such as a spring 300 shown in FIG. 3C. Whereas spring 300 has an overall external shape similar to springs 283 and 285, spring 300 is formed comprising a plurality of component strips 302. For a given size and external envelope, a leaf spring formed having individual component strips is generally more energy efficient and more easily conditioned to remember a desired shape than a spring having the same envelope shape formed as a single solid piece.

Figure 4:
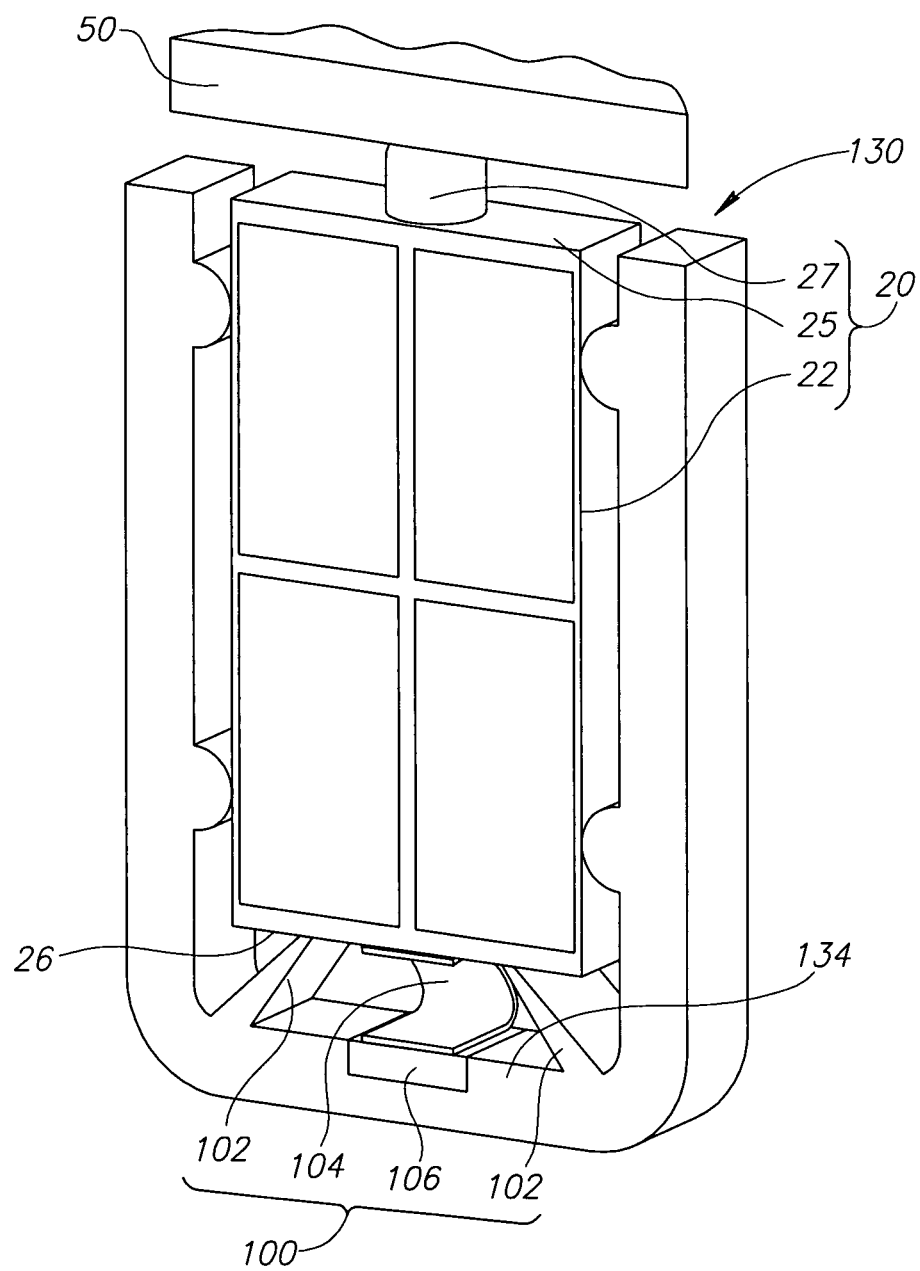
FIG. 4 schematically shows a coupling apparatus comprising a shape memory component that is cooled to provide different coupling forces for coupling a piezoelectric motor to a moveable body, in accordance with an embodiment of the invention.

FIG. 4 schematically shows a coupling apparatus 100, in accordance with an embodiment of the invention.

Coupling apparatus 100 is optionally comprised in a motor mounting frame 130 and optionally comprises elastic biasing fingers 102 that are integrally formed with the motor frame and provide a coupling force to engage piezoelectric motor 20 to moveable body 50. Optionally, motor frame 130 is injection molded from a suitable plastic. Coupling apparatus 100 additionally comprises a leaf spring 104 formed from an SMA material that is mounted to base bar 134 of frame 120 and is thermally coupled to a cooling device, optionally a Peltier thermoelectric element 106, optionally positioned in the base bar.

The transformation temperature of leaf spring 104 is below the normal ambient temperature of an environment in which piezoelectric motor 20 is expected to operate. As a result, normally, leaf spring 104 is in an austenite phase. In the austenite phase the leaf spring assumes, and aggressively maintains, a remembered shape shown in FIG. 4, presses against bottom edge surface 26 of vibrator 22 and contributes to the coupling force that engages motor 20 to moveable body 50. In accordance with an embodiment of the invention, Peltier element 106 is controlled to cool leaf spring 104 to a temperature below its transformation temperature to cause the leaf spring to undergo phase change to the martensite phase. In the martensite phase, leaf spring 104 becomes pliable and does not apply force to bottom edge surface 26 of vibrator 22, thereby reducing the net coupling force that presses friction nub 27 to body 50 and disengaging piezoelectric motor 20 from the body.

Whereas in the above description of embodiments of the invention, a shape memory component is described as having a single remembered shape, some shape memory components can be trained to exhibit two-way shape memory and have two remembered shapes, each of which the component maintains stably. Generally, whereas a first remembered shape is an austenite shape, a second remembered shape is a martensite phase shape and the component is switched between the remembered shapes by controlling the temperature of the component. In accordance with an embodiment of the invention, one of the remembered shapes is used to provide a first coupling force for coupling a piezoelectric motor to a moveable body and the other remembered shape is used to provide a second coupling force for coupling the motor to the body. For example, a same leaf spring similar to a leaf spring shown in FIGS. 3A-3C having first and second remembered shapes may be controlled to provide first and second different coupling forces when assuming the first and second remembered shapes respectively. In the first remembered shape, the spring provides coupling force sufficient to maintain a piezoelectric motor disengaged from but in contact with a load and in the second shape a coupling force that engages the motor with the load.

Figure 5A:
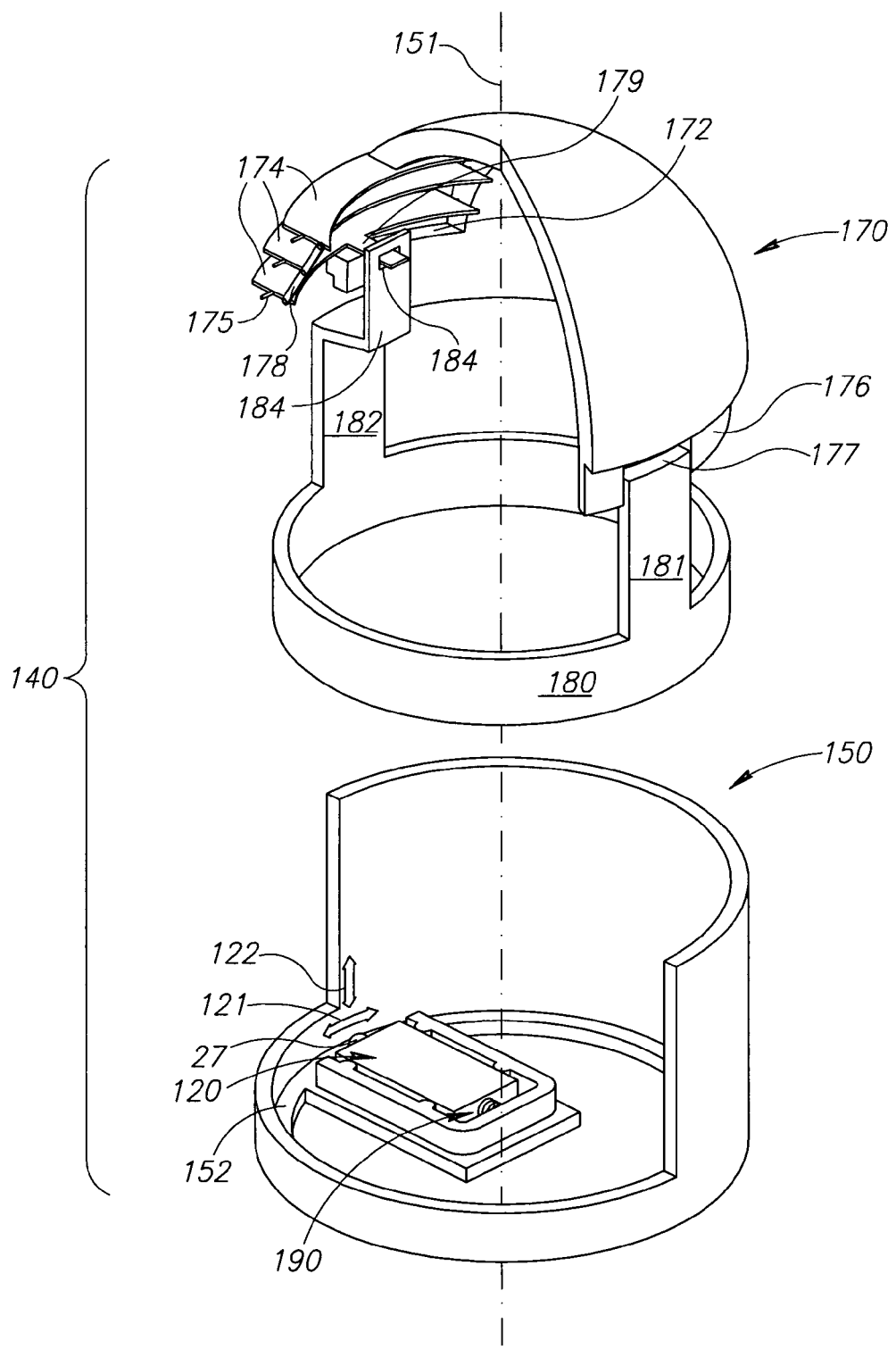
FIGS. 5A and 5B schematically show an air conditioning vent controllable by a piezoelectric motor engaged to the vent using a coupling apparatus in accordance with an embodiment of the invention.
Figure 5B:
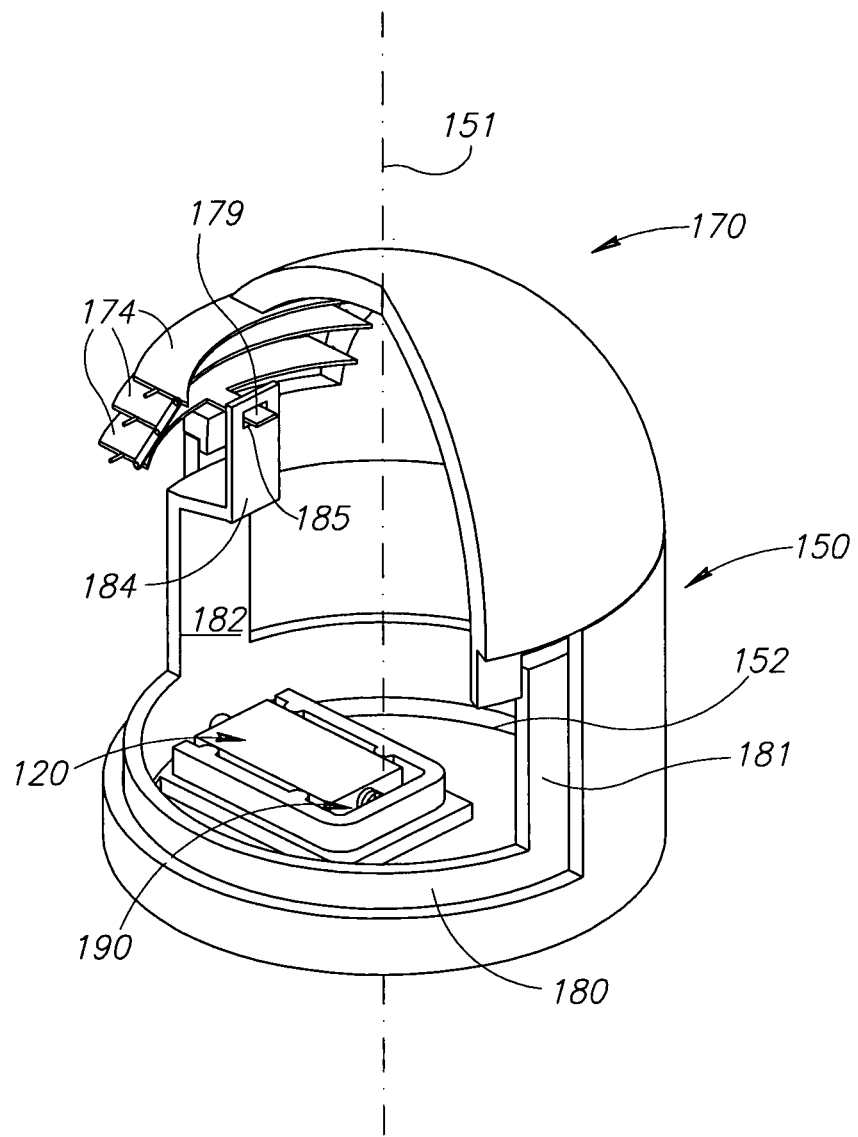

FIGS. 5A and 5B schematically show partially cutaway, exploded and assembled views respectively of an optionally air conditioning vent 140 comprising a piezoelectric motor 120 controllable to direct air venting from an exit port of the vent, in accordance with an embodiment of the invention. Piezoelectric motor 120 is coupled to the vent using a coupling apparatus in accordance with an embodiment of the invention so that the motor can be disengaged from the vent and a direction in which air flows out from the vent can be adjusted manually. Air conditioning vent 140 can be advantageous for directing air provided by an automotive air conditioning system.

Air vent 140 optionally comprises a cylindrical support air duct 150 and an air vent outlet head, optionally a hemispherical turret 170 having an exit port 172 in which a configuration of direction vanes 174 is mounted. Turret 170 optionally comprises a skirt 176 that enables the turret to be fit into support duct 150 so that the turret can rotate freely about the axis, indicated by a dashed line 151 of the duct. Optionally, turret 170 and air duct 150 are formed with matching parts of a suitable snap in connection that allows the turret to be snap fit into the duct.

Vanes 174 in exit port 172 are rotatably mounted in the exit port using any of various devices and methods known in the art so that they can be tilted up or down as required to direct air exiting the port in a desired direction. In FIGS. 5A and 5B the vanes are mounted to turret 170 so that they are rotatable using two pins 175, which are optionally integrally formed on each vane 174. Vanes 174 are optionally mechanically coupled together by at least one connection strut 178 so that the vanes rotate together. A bottom vane of vanes 174 optionally has a "tilt" handle 179, which can be pushed "up" or "down" to change pitch of the vanes.

Turret 170 and vanes 174 are optionally coupled to a drive annulus 180 having at least one activation arm and which fits inside duct 150 so that it is freely rotatable about the duct's axis 151 and movable up or down along the axis. By way of example, drive annulus 180 comprises two activation arms 181 and 182. Each activation arm 181 and 182 fits into a corresponding slot 177 (only one of which is shown) formed in skirt 176 of turret 170 in which the arm can slide up and down. Activation arm 182 is coupled to tilt handle 179 by a tilt strut 184 formed with a hole 185 for receiving the tilt handle. Drive annulus 180 optionally has a position at which it substantially rests on a bottom ledge 152 of air duct 150. Optionally, dimensions of stilt 182, tilt strut 184 and tilt handle 179 are such that when drive annulus 180 rests on bottom ledge 152 of duct 150, vanes 174 are tilted maximally upwards so that they substantially close exit port 172. Hemisphere 170 can be rotated to direct its exit port 172 to face in a desired direction by rotating drive annulus 180. Vanes 174 can be tilted to a desired tilt angle by moving the drive annulus up or down inside air duct 150 along axis 151.

At least one piezoelectric motor 120 is coupled to drive annulus 180 to provide the motion required to rotate and translate the drive annulus and thereby orient exit port 172 and vanes 174 in desired positions. Optionally, the at least one piezoelectric motor comprises a single motor 120 that can provide both rotation and translation. Optionally, piezoelectric motor 120 is similar to a motor described in U.S. Pat. No. 7,075,211 referenced above, has a shape similar to piezoelectric motor 20 shown in FIGS. 1-4 and comprises a thin rectangular vibrator having a friction nub 27 located at a narrow edge surface thereof.

Motor 120 has a configuration of electrodes (not shown) and a power supply for exciting vibrations in friction nub 27 that apply force to drive annulus 180 selectively along either "transverse" direction indicated by a double arrowhead 121 and selectively along either "vertical" direction indicated by a double arrowhead block arrow 122. Force provided by motor 120 applied along transverse directions 121 is controlled to rotate turret 170 selectively clockwise or counterclockwise about axis 151 and thereby orient exit port 172 in a desired direction. Force applied by the motor along vertical directions 122 is controlled to translate drive annulus 180 selectively up or down and tilt vanes 174 respectively down or up to a desired tilt angle.

In accordance with an embodiment of the invention, piezoelectric motor 120 is coupled to drive annulus 180 by a coupling apparatus 190 that is controllable to selectively engage and disengage the motor from the drive annulus. Turret 170 and vanes 174 can therefore be oriented by the motor or manually respectively. Optionally, the coupling apparatus is a coupling apparatus, such as for example a coupling apparatus similar to coupling apparatus 40 (FIG. 1), 70 (FIG. 2A) or 270 (FIG. 2B), that comprises an SMA component and is controllable to selectively engage and disengage the motor from the drive annulus by controlling the SMA component.

It is noted that whereas a single piezoelectric motor 120 is used to provide both rotation of drive annulus 180 and translation of the drive annulus in air vent 140, in some embodiments of the invention a motor that is used to provide rotation of annulus 180 is different from a motor used to provide translation of the annulus. At least one of the motors is coupled to the annulus by a coupling apparatus in accordance with an embodiment of the invention.

In some embodiments of the invention, coupling apparatus 190, maintains piezoelectric motor 120 disengaged from annulus 180 and is activated to engage the motor. Turret 170 and vanes 174 may therefore normally be oriented manually and when it is desired to have motor 120 orient the turret and/or the vanes, coupling apparatus 190 is activated to couple the motor to drive annulus 180.

In some embodiments of the invention, coupling apparatus 190 is controlled to couple motor 120 to drive annulus 180 by manually operating an interface (not shown), such as a keyboard, touch screen, mouse or track ball of an appropriate controller (not shown). For example, coupling apparatus 190 might engage motor 120 only when a user manually activates a track ball coupled to the controller and suitably controls the track ball to orient turret 170 and vanes 174. Optionally, the controller is programmed with a set of discrete orientation settings for turret 170 and vanes 174 and the user chooses a desired setting by appropriately operating the track ball. By way of another example, the controller interface may be a set of radio buttons. Pressing a given radio button causes the controller to activate the coupling apparatus to engage motor 120 and operate piezoelectric motor 120 to orient turret 170 and/or vanes 174 responsive to the given radio button.

In some embodiments of the invention, a controller for controlling coupling apparatus 190 comprises an audio sensor and is voice activated. For example, assuming that vent 140 is used in a vehicle, a person getting into, optionally the driver seat, may recite his or her name out loud. In response, the controller activates the coupling apparatus to direct the vent to a preprogrammed setting associated with the recited name. Optionally, each seat in the vehicle is associated with a different voice activated air vent similar to vent 140. When a person sitting in the seat recites his or her name, the controller determines, using any of various devices and methods known in the art from which seat the voice that vocalizes the name is coming from and sets the associated vent accordingly.

In some embodiments of the invention, air vent 140 is activated and controlled "biometrically", for example responsive to face recognition or finger print identification. By way of a "biometric" example, the vehicle may be equipped with a 3D vision system comprising a 3D camera described in U.S. Pat. No. 6,100,517 that images a person or persons that might be sitting in the vehicle. Optionally, the system processes images provided by the camera to determine size and/or identity of a person or persons in the vehicle. A controller receives the size and/or identity data and controls the air vent responsive thereto.

Whereas in the above described air vent control systems, coupling apparatus 190 maintains piezoelectric motor 120 normally disengaged from drive annulus 180, in some embodiments of the invention, the coupling apparatus is controlled to normally maintain the motor engaged to the drive annulus. When engaged, the controller optionally controls motor 120 to perform any of the orientation functions that the motor performs when engaged as described above. The controller activates the coupling apparatus to disengage the motor and permit a user to manually orient turret 170 and/or vanes 174, responsive to operation of any interface suitable for receiving appropriate inputs from the user.

For example, a voice activated controller that controls coupling apparatus 190 to normally maintain motor 120 engaged, may respond to the recited word "manual" to disengage the motor. Optionally, a haptic sensor determines when a human hand touches turret 170 or vanes 174, or a control handle attached to the turret and/or vanes, and transmits a signal to a controller to indicate that it should disengage piezoelectric motor 120 and allow manual control of vent 140. Optionally, motor 120 or motor mounting frame 30 is coupled to a strain gauge that generates signals when manual orientation of vent 140 is attempted and motor 120 is engaged and the controller disengages the motor responsive to the strain gauge signals.

Whereas in the above description of an air vent, a coupling apparatus is controlled by controlling an SMA component to disengage or engage a piezoelectric motor, in some embodiments of an air vent, the motor is controlled to disengage by controlling the motor to "idle". When idling, the motor is excited so that friction nub 27 vibrates substantially only in a direction perpendicular to a surface region of drive annulus 140 that the friction nub contacts. Methods of controlling a piezoelectric motor by controlling it so that its friction nub vibrates substantially only in a direction perpendicular to a surface of a load to which the motor is coupled so that it disengages from the load are described, by way of example, in U.S. Pat. No. 7,075,211.

In the description and claims of the present application, each of the verbs, "comprise" "include" and "have", and conjugates thereof, are used to indicate that the object or objects of the verb are not necessarily a complete listing of members, components, elements or parts of the subject or subjects of the verb.

The invention has been described using detailed descriptions of embodiments thereof that are provided by way of example and are not intended to limit the scope of the invention. The described embodiments comprise different features, not all of which are required in all embodiments of the invention. Some embodiments of the invention utilize only some of the features or possible combinations of the features. Variations of embodiments of the invention that are described and embodiments of the invention comprising different combinations of features noted in the described embodiments will occur to persons of the art. For example, whereas some SMA components discussed above are heated by passing a current through them, in some embodiments of the invention the SMA components are heated by thermal contact with a suitable heating element, such as a Peltier heater. And, an SMA control wire such as SMA control wire 47 may be coupled to a coil or portion of a coil spring by methods other than an anchor plate. For example, the control wire may be bonded directly to a coil or coupled to a bar that extends across and is attached to a coil. The scope of the invention is limited only by the following claims.

The invention claimed is:

1. Apparatus for coupling a piezoelectric motor to a moveable body, the motor having a coupling surface for coupling to the moveable body, the apparatus comprising:
at least one elastic element that provides at least a portion of a coupling force for pressing the coupling surface of the piezoelectric motor to the moveable body; and
at least one shape memory component that is controllable to change shape and/or phase;
wherein the at least a portion of the coupling force provided by an elastic element of the at least one elastic element changes responsive to changes in shape and/or phase of the at least one memory component, and the at least one shape memory component comprises at least two wires made from a shape memory material, the wires coupled to a different part of a same elastic element of the at least one elastic element.

2. Apparatus according to claim 1 wherein the at least two wires are coupled to an elastic element of the at least one elastic element.

3. Apparatus according to claim 1 wherein the at least two wires are controllable to change shape by changing length from a longer length to a shorter length.

4. Apparatus according to claim 1 wherein when the at least two wires shorten, at least a portion of the at least one elastic element compresses.

5. Apparatus according to claim 1 wherein when the wires shorten, at least a portion of the at least one elastic element bends.

6. Apparatus according to claim 1 wherein the at least one elastic element comprises at least one spring.

7. Apparatus according to claim 6 wherein the at least one spring comprises at least one coil spring.

8. Apparatus according to claim 7 wherein when at least one wire changes shape only a portion of a coil spring of the at least one coil spring compresses.

9. Apparatus according to claim 1 wherein the at least one elastic element comprises at least one leaf spring having at least one leaf coupled to at least one wire.

10. Apparatus according to claim 9 wherein when the at least two wires change shape, the at least one leaf bends.

11. Apparatus according to claim 1 wherein each wire of the at least two wires is controllable to shorten independently of the other of the two wires.

12. Apparatus according to claim 11 wherein as more of the wires are shortened, the at least a portion of the coupling force provided by the same elastic element progressively decreases.

13. Apparatus according to claim 1 wherein the at least one shape memory component has a first phase in which it assumes a remembered shape that it maintains under relatively large stress and a second pliable phase in which it is plastically deformable by relatively small stress and the component is controllable to change shape to or from the remembered shape respectively from or to a shape to which it is deformed in the second phase.

14. Apparatus according to claim 13 wherein an elastic element of the at least one elastic element is a shape memory component of the at least one shape memory component.

15. Apparatus according to claim 13 wherein the at least one shape memory component is characterized by a transformation temperature above which it is in the first phase and below which it is in the second phase.

16. Apparatus according to claim 15 wherein the transformation temperature is a temperature greater than an ambient temperature of an environment in which the piezoelectric motor is expected to operate.

17. Apparatus according to claim 15 wherein the transformation temperature is a temperature less than an ambient temperature of an environment in which the piezoelectric motor is expected to operate.

* * * * *